United States Patent
DeMeester et al.

(10) Patent No.: US 6,552,538 B2
(45) Date of Patent: Apr. 22, 2003

(54) RF TRANSMIT CALIBRATION FOR OPEN MRI SYSTEMS

(75) Inventors: Gordon D. DeMeester, Wickcliffe, OH (US); Michael Burl, Chagrin Falls, OH (US); Michael A. Morich, Mentor, OH (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 34 days.

(21) Appl. No.: 09/833,003

(22) Filed: Apr. 11, 2001

(65) Prior Publication Data

US 2002/0149365 A1 Oct. 17, 2002

(51) Int. Cl.[7] .................................................. G01V 3/00
(52) U.S. Cl. ........................ 324/307; 324/309; 324/318
(58) Field of Search ................................. 324/307, 309, 324/318, 322

(56) References Cited

U.S. PATENT DOCUMENTS

| | | | |
|---|---|---|---|
| 4,866,386 A | * | 9/1989 | Sattin .......................... 324/312 |
| 4,886,386 A | | 12/1989 | Paffhausen et al. |
| 4,983,921 A | * | 1/1991 | Kramer et al. ............... 324/309 |
| 5,343,149 A | * | 8/1994 | Hanawa ........................ 324/307 |
| 5,416,412 A | * | 5/1995 | Slayman et al. ............. 324/309 |
| 5,986,454 A | | 11/1999 | Leifer |
| 5,986,455 A | | 11/1999 | Magnuson |
| 6,198,960 B1 | * | 3/2001 | Fain et al. .................... 324/306 |
| 6,268,728 B1 | * | 7/2001 | Morrell ........................ 324/307 |
| 6,275,036 B1 | * | 8/2001 | van Yperen et al. ......... 324/306 |
| 6,307,368 B1 | * | 10/2001 | Vasanawala et al. ......... 324/300 |

FOREIGN PATENT DOCUMENTS

| | | |
|---|---|---|
| EP | 0414474 | 2/1991 |
| EP | 0608426 | 8/1994 |
| JP | 61095237 | 5/1986 |
| JP | 03051038 | 3/1991 |

* cited by examiner

Primary Examiner—Edward Lefkowitz
Assistant Examiner—Dixomara Vargas
(74) Attorney, Agent, or Firm—Fay, Sharpe, Fagan, Minnich & McKee, LLP

(57) ABSTRACT

A pair of quadrature radio frequency coils (32, 34) disposed adjacent an imaging region (10) are typically loaded differently due to factors such as subject geometry, subject mass, and a relative distance from the subject. A tip angle adjustment circuit (50) monitors a combined tip angle adjacent a mid-plane of the examination region, such as by analyzing delivered and reflected power to each of the coils. An adjustment circuit (54) adjusts relative RF power or amplitude to produce a selected, combined tip angle in the examination region.

16 Claims, 2 Drawing Sheets

RF TRANSMIT CALIBRATION FOR OPEN MRI SYSTEMS

BACKGROUND OF THE INVENTION

The present invention relates to the diagnostic imaging arts. It finds particular application in conjunction with open MRI systems with a main magnetic field greater than 0.5 T and will be described with particular reference thereto. It will be appreciated, however, that the present invention is useful in conjunction with other systems containing more than one radio frequency coil, such as bore type MRI systems, spectroscopy systems, low field systems, and the like, and is not limited to the aforementioned application.

In magnetic resonance imaging, a uniform main magnetic field is created through an examination region in which a subject to be examined is disposed. With open magnetic resonance systems, the main magnetic field is typically vertical, perpendicular to the subject between upper and lower poles. A series of radio frequency (RF) pulses are applied to two RF coils, one adjacent each pole, to excite and manipulate magnetic resonance. Gradient magnetic fields are conventionally produced by gradient coils mounted between the RF coils and the poles to encode spatial position and other information in the excited resonance. The magnetic resonance signals are detected with the two RF coils or localized coils and processed to generate two or three dimensional image representations of a portion of the subject in the examination region.

Typically, the patient is placed in the examination region on his/her back close to the bottom pole assembly and further from the upper pole assembly to maximize openness in front of the patient. This causes uneven loading of the upper and lower RF coils during transmit, resulting in each coil having different RF power coupling to the patient. That is, the coils contribute unevenly to the imaging process. Patient geometry also contributes to different loading of the two RF coils. The anterior and posterior shapes of the body are not the same and are different at different positions along the length of the patient. The loading and RF power coupling experienced by the two coil assemblies due to this geometry variation are different.

With relatively low main fields of existing open systems, this phenomenon has not been a significant problem. However, as main fields increase, the uneven loading of the RF coils can become problematic in that the output images have non-uniform intensity such that they become unusable for diagnostic imaging.

In the higher fields of bore systems, a birdcage RF coil design is typically used, with the RF quadrature drive for the coil located 45 degrees to either side of the down position so that it is least affected by vertical patient location and shape. Generally though, the head to foot central axis of the patient is very close to the main axis of the bore, i.e. loading is relatively symmetric.

Conventionally, calibrated RF pulses are used to excite and manipulate the MR signal. That is, the excitation or tip angles, 180° inversion angles, other spin system manipulation as well as which nuclei are resonated are precisely achieved with carefully calibrated RF pulses. In order to reorient the magnetization, the amplitude and phase of the RF envelope as a function of time is precisely controlled. The patient mass influences the loading of the RF coils which affects the reflected RF power and the forward RF power coupled into the coil. For each patient anatomy, the RF field is separately amplitude calibrated to achieve the proper tip angle. For a patient disposed symmetrically, this typically consists of exciting a transverse slab with a nominal 90° pulse and adjusting the RF amplitude until a 90° magnetization tip or flip angle is achieved. Depending on patient girth, the loading of the RF coils can differ greatly from patient to patient.

The present invention provides a new and improved method and apparatus that overcomes the above referenced problems and others.

SUMMARY OF THE INVENTION

In accordance with one aspect of the present invention, a magnetic resonance apparatus includes a vertical field main magnet system which generates a main temporally constant field through an examination region. An upper radio frequency coil and a lower radio frequency coil excite magnetic resonance in selected nuclei located in the examination region. An RF transmitter drives upper and lower RF coils that generate radio frequency magnetic fields that excite and manipulate magnetic resonance. The same coils may be used to receive resonance signals as well. An RF tip angle adjustment circuit is used to separately calibrate two RF coils to achieve the desired spin tip angles that are produced when driving the combined coils.

In accordance with a more limited aspect of the present invention, the tip angle analyzer contains a means by which it detects the tip angle caused by the RF coils. In order to adjust the tip angle for the desired effect, the RF tip angle analyzer changes the RF power directed to the transmitter coils.

In accordance with a more limited aspect of the present invention, the magnetic resonance apparatus transmits and receives magnetic resonance manipulation signals in quadrature.

In accordance with another aspect of the present invention, a magnetic resonance apparatus is given. A magnet assembly generates a main magnetic field through and examination region. First and second RF coil assembles are disposed opposite each other, adjacent the imaging region. An RF transmitter provides RF pulses to the coil assemblies. An RF monitor measures the RF power delivered by the coil assemblies separately. An RF tip angle calculator measures the tip of induced resonance in order to produce more desired tip angles.

According to a more limited aspect of the present invention, RF tip angle calculator retrieves adjustment data from a memory look up table.

According to another aspect of the present invention, a method of magnetic resonance is given. Two RF transmit coils are disposed adjacent an examination region. Magnetic resonance is selectively excited and tip angles of the resonance are measured and adjusted. The tip angles are adjusted by adjusting an RF pulse amplitude and a radio frequency.

According to another aspect of the present invention, a method of magnetic resonance is given. Two RF transmit coils are disposed adjacent an examination region. Magnetic resonance is selectively excited and tip angles of the resonance are measured and adjusted to produce a tip angle of a desired amount.

According to another aspect of the present invention, a method of magnetic resonance is given. Two RF coils are disposed opposite each other, adjacent an examination region. Total power and reflected power for each of the coils is measured. Power delivered into the examination region is calculated. The relative power to each coil is adjusted, thereby adjusting the tip angle in a selected region near a midplane.

One advantage of the present invention is that it provides RF transmit coils for open machines with higher main fields.

Another advantage of the present invention is that it permits off center placement of the subject, vertically and longitudinally.

Another advantage of the present invention is that it allows for images with better signal uniformity.

Another advantage of the present invention is that it provides better RF transmit fields for MRI.

Yet another advantage resides in a higher signal-to-noise ratio.

Still further benefits and advantages of the present invention will become apparent to those skilled in the art upon a reading and understanding of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENT

Figure 1:
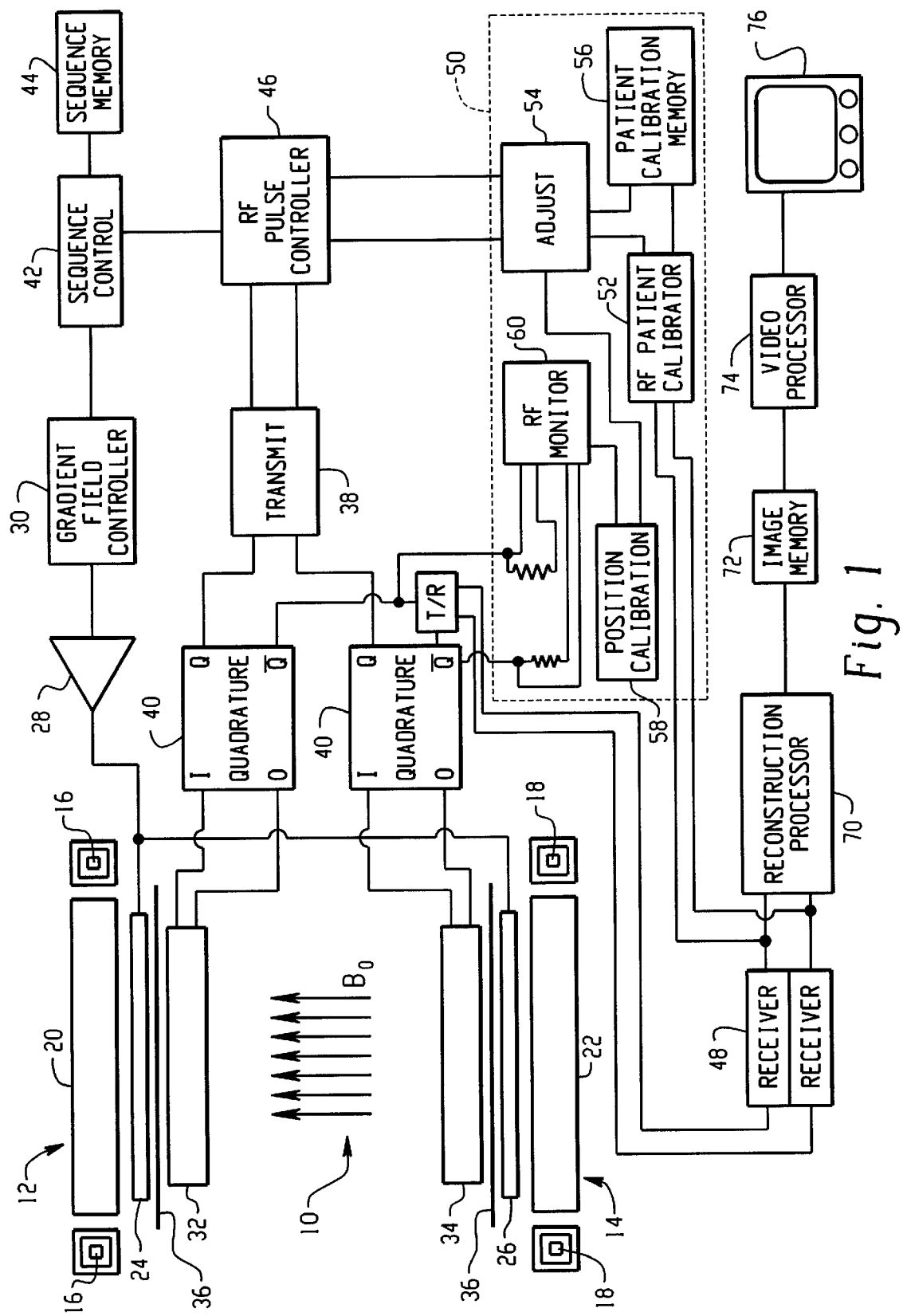
FIG. 1 is a diagrammatic illustration of a magnetic resonance imaging system in accordance with a preferred embodiment of the present invention.

With reference to FIG. 1, in an open MRI system, an imaging region 10 is defined between an upper pole assembly 12 and a lower pole assembly 14. A pair of annular super-conducting magnets 16, 18 surround upper and lower pole pieces 20, 22 generating a temporally constant, main magnetic field $B_0$ through the imaging region 10. It is to be appreciated that the open MRI apparatus may have a variety of pole pieces or, in some instances, no pole pieces at all. The magnets for generating the main magnetic field can be positioned at other locations. Optionally, a ferrous flux return path is provided between the pole assemblies remote from the imaging region 10.

For imaging, magnetic field gradient coils 24, 26 are disposed on opposite sides of the imaging region 10 adjacent the pole pieces 20, 22. In the preferred embodiment, the gradient coils are planar coil constructions which are connected by gradient amplifiers 28 to a gradient magnetic field controller 30. The gradient magnetic field controller 30 causes current pulses which are applied to the gradient coils 24, 26 such that gradient magnetic fields are superimposed on the temporally constant and uniform field $B_0$ across the imaging region 10. The gradients of the fields aligned with the main field are typically oriented along a longitudinal or y-axis, a vertical or z-axis and a transverse or x-axis.

For exciting magnetic resonance in selected nuclei, an upper radio frequency coil 32 and a lower radio frequency coil 34 are disposed between the gradient coils 24, 26 adjacent the imaging region 10. The coils 32,34 generate RF frequency magnetic fields, typically denoted $B_1$, within the imaging region. The coils 32, 34 can be connected to one or more RF transmitters 38. RF screens 36 are disposed between the RF coils 32, 34 and the gradient coils 24, 26 to minimize the generation of RF eddy currents in the gradient coils 24, 26. The RF coils 32, 34 transmit $B_1$ magnetic field pulses into the imaging region. The received signals are processed into in-phase and 90° out-of-phase quadrature signals.

The quadrature circuits 40 in the preferred embodiment have four ports, and operate in both transmit and receive modes. In transmit mode, the quadrature circuit 40 splits a signal received on a parallel port Q from one of the RF transmitters 38 and splits it into two components that are 90° out of phase with respect to each other. The circuit splits the signal, and sends the original out of an in-phase port I and phase-shifts the signal a quarter wave length and sends the out-of-phase component to an out-of-phase port O. The quadrature signals are then passed to the RF coils 32, 34.

Prior to conducting an imaging sequence, a series of calibration pulses are applied for each patient to calibrate the macroscopic magnetization tip angle produced by the $B_1$ RF frequency pulses. A sequence controller 42 accesses a sequence memory 44 to withdraw one or more RF calibration pulse sequences, which are implemented by a RF pulse controller 46. Typically, the sequence control causes the pulse controller and the RF transmitter to generate a stimulated echo pulse sequence or some other sequence sensitive to RF calibration. The resultant resonance is passed from the quadrature circuits to receivers 48 in the receive portions of the sequence by a transmit/receive (T/R) switch. An adjustment circuit 50 includes an RF patient calibration circuit 52, more particularly a tip angle calculator. The RF patient calibration circuit 52 controls an amplitude adjustment circuit 54 to adjust an amplitude of the RF pulse envelopes until the desired tip angle is achieved for example, 90°. In the preferred embodiment, with the patient positioned between the two transmit coils, RF pulses are directed to either the top or the bottom coil. The RF pulse amplitude is then calibrated for each coil separately and then stored in the patient calibration memory 56. Subsequently, half of the calibrated amplitude from memory 56 for the respective coil is applied for the combined transmit signal. Alternatively, the separate coil calibrations can be used to set the proper ratio of RF amplitude to the top and bottom coils then the combined transmit signal calibrated for the proper tip angle.

When the patient is moved into an imaging position in which the patient is not symmetrically disposed between the upper and lower RF coils, there is an imbalance in the loading on the two coils. In order to correct for the uneven loading, the amplitude of the RF envelope, which is sent to each of the upper and lower coils, is adjusted.

The relative position of the patient between the two RF coils can be determined in various ways. In one embodiment, patient loading is determined by reflected power. More specifically, when radio pulses are input into the Q port of the quadrature circuits 40, an output signal appears on the fourth port $\overline{Q}$, of the quadrature hybrid. When the patient is centered, the reflected power at both coils is equal. When the patient is shifted toward one coil or the other, the reflected power also shifts. An RF monitor 60 measures the reflected power from each RF coil and provides an output indicative of the loading by the patient which addresses the calibration memory 58 to retrieve the appropriate gain factor for the adjustment circuit 54.

Figure 2:
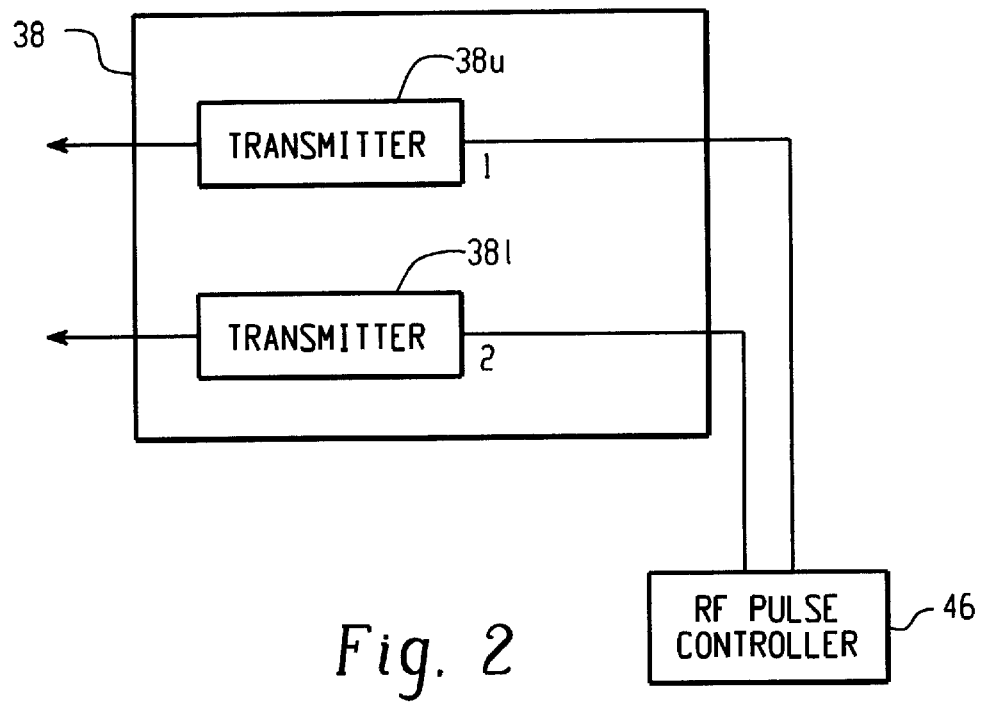
FIG. 2 is a representation of a two transmitter embodiment.
Figure 3:
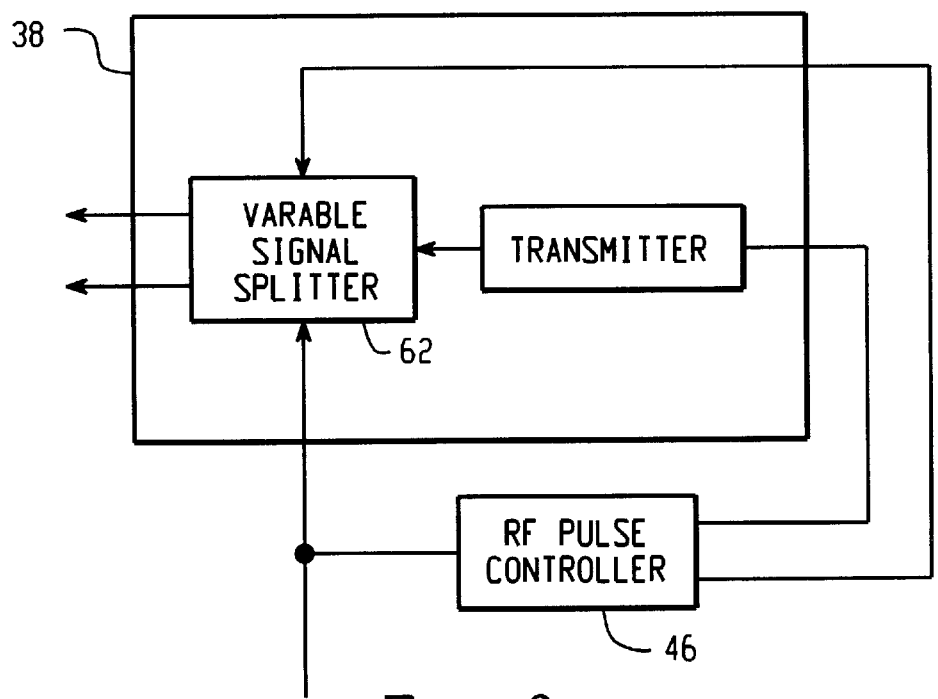
FIG. 3 is a representation of a single transmitter embodiment.

In the embodiment of FIG. 2 the gain of two transmitters 38u, 38l is adjusted. In this embodiment, each transmitter has a separate amplitude driver dedicated to the purpose of adjusting its own signal. Thus, different RF amplitude pulses are transmitted to the two coils. In the embodiment of FIG. 3, a variable signal splitter 62 adjusts the relative amplitude of the RF pulses supplied to each coil.

In applications in which the radio frequency coils 32, 34 operate in both transmit and receive modes, magnetic resonance signals are picked up by the radio frequency coils 32, 34. The resonance signals are demodulated by one or more receivers 48, preferably digital receivers. In the illustrated embodiment, two receivers demodulate the quadrature signals from each quadrature combiner 40. Alternately, The signals from each RF coil can be combined by the quadrature combiners before demodulation. The digitized signals are processed by a reconstruction processor 70 into volumetric or other image representations which are stored in a volumetric image memory 72 A video processor 74, under operator control, withdraws selected image data from the volume memory and formats it into appropriate data for display on a human readable display 76, such as a video monitor, active matrix monitor, liquid crystal display, or the like.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance apparatus comprising:
   a magnet assembly which generates a temporally constant main magnetic field through an examination region;
   a first RF coil assembly disposed on a first side of the examination region;
   a second RF coil assembly disposed on a side of the examination region;
   at least one RF transmitter that transmits individual radio frequency resonance excitation and manipulation pulses to the first and second RF coil assemblies to induce and manipulate resonance;
   an RF tip angle calculator which receives and measures the resonance induced by the first RF coil assembly separately from the resonance induced by the second RF coil assembly within a selected region of the subject; and,
   a means for independently adjusting the individual radio frequency pulses transmitted to the first and second coil assemblies to adjust the tip angles of the induced resonance to produce a selected combined tip angle in the selected region.

2. The magnetic resonance apparatus set forth in claim 1, wherein the first and second RF coil assemblies are on opposite sides of the examination region.

3. The magnetic resonance apparatus set forth in claim 1, further including:
   a receive only magnetic resonance receive coil disposed adjacent the selected region.

4. The magnetic resonance apparatus set forth in claim 1, wherein the first and second RF coils include a quadrature pair.

5. A magnetic resonance apparatus comprising:
   a magnet assembly which generates a temporally constant main magnetic field through an examination region;
   a first RF coil assembly disposed on a first side of the examination region;
   a second RF coil assembly disposed on a second side of the examination region;
   at least one RF transmitter that transmits radio frequency resonance excitation and manipulation pulses to the first and second RF coil assemblies to induce and manipulate resonance;
   an RF tip angle calculator which receives and measures the resonance induced by the first RF coil assembly separately from the resonance induced by the second RF coil assembly within a selected region of the subject, the RF tip angle calculator including:
      a calculator means for separately analyzing the tip angles induced in the selected region by the first RF coil assembly and by the second RF coil assembly; and,
   an adjustment means for separately adjusting an amplitude of the radio frequency excitement and manipulation pulses supplied to the first RF coil assembly and to the second RF coil assembly to adjust the tip angles of the induced resonance to produce a selected combined tip angle in the selected region.

6. A magnetic resonance apparatus comprising:
   a magnet assembly which generates a temporally constant main magnetic field through an examination region;
   a first RF coil assembly disposed adjacent the examination region;
   a second RF coil assembly disposed adjacent of the examination region displaced from the first RF coil assembly;
   at least one RF transmitter that separately transmits radio frequency resonance excitement and manipulation pulses to the first and second RF coil assemblies to induce and manipulate resonance;
   a calculator which separately analyzes tip angles induced in the subject by the first RF coil assembly and by the second RF coil assembly; and,
   an adjustment means that determines a relative power transmitted to each coil assembly and a total combined power to all RF coil assemblies.

7. A magnetic resonance apparatus comprising:
   a magnet assembly which generates a temporally constant main magnetic field through an examination region;
   a first RF coil assembly disposed on one side of the examination region;
   a second RF coil assembly disposed on an opposite side of the examination region;
   at least one RF transmitter that provides radio frequency resonance excitation and manipulation pulses to the first and second RF coil assemblies for inducing and manipulating magnetic resonance in a selected region of the subject;
   an RF monitor that separately measures an RF field created by the first RF coil assembly and an RF field created by the second RF coil assembly;
   an RF tip angle calculator which measures a tip angle of induced resonance from the combined RF coil assemblies and separately calculates at least one adjusted RF pulse characteristics for the RF pulses provided to the first RF coil assembly and at least one adjusted RF pulse characteristic for the RF pulses provided to the second coil assembly to produce a selected combined tip angle in the selected region.

8. A magnetic resonance apparatus comprising:
   a magnet assembly which generates a temporally constant main magnetic field through an examination region;
   a first RF coil assembly disposed adjacent the examination region;
   a second RF coil assembly disposed adjacent the examination region;

at least one RF transmitter that provides radio frequency resonance excitement and manipulation pulses to the first and second RF coil assemblies for inducing and manipulating magnetic resonance in a selected region of the subject;

an RF monitor circuit which individually measures an amount of RF reflected power from the first RF coil assembly and from the second RF coil assembly due to loading of the first and second RF coil assemblies by the patient;

a memory from which RF tip angle calibration data is retrieved based on the measured reflected powers; and, an adjustment circuit that adjusts relative RF power delivered to the first RF coil assembly and the second RF coil assembly based on the retrieved tip angle calibration data.

9. The magnetic resonance apparatus as set forth in claim 7, wherein the RF calculator includes:

a memory look-up table that contains a correlation between coil loading and tip angle.

10. The magnetic resonance apparatus set forth in claim 8, wherein the first and second RF coil assemblies include quadrature coils and further including:

a first quadrature combiner having in-phase and quadrature ports connected with the first quadrature RF coil, an input port connected with at least one transmitter, and a fourth port which provides a measure of reflected power from the first quadrature RF coil;

a second quadrature combiner having in-phase and quadrature ports connected with the second quadrature RF coil, an input port connected with at least one transmitter, and a fourth port which provides a measure of reflected power from the second quadrature RF coil.

11. The magnetic resonance apparatus as set forth in claim 10 wherein the RF calculator calculates the net-delivered power from the reflected power and power input into the RF coils.

12. A method of magnetic resonance comprising:

disposing two RF transmit coils adjacent opposite sides of an examination region of a magnetic resonance imager, which RF coils are unevenly loaded by a subject;

determining a reflection coefficient by measuring a forward power and a reflected power for each coil;

accessing a look up table relating the reflection coefficient to a coil efficiency and then adjusting a relative power delivered to each transmit coil such that each coil contributes equally to an excitation.

13. The method as set forth in claim 12 further including:

adjusting the tip angle for the combined RF coils to a selected tip angle adjacent a midplane of the examination region.

14. A magnetic resonance method comprising:

generating a temporally constant magnetic field through an examination region;

providing radio frequency electrical pulses concurrently to first and second RF coil assemblies to induce and manipulate magnetic resonance;

measuring a characteristic of resonance induced by the radio frequency pulses transmitted to the first RF coil assembly separate from measuring a characteristic of resonance induced from the RF pulses transmitted to the second RF coil assembly;

individually adjusting the radio frequency electrical pulses provided to the first and second coil assemblies in accordance with the measured magnetic resonance characteristics to adjust a combined tip angle of the magnetic resonance induced by the first and second RF coil assemblies together.

15. The method as set forth in claim 14 wherein the step of measuring the resonance induced by the first and second RF coil assemblies includes:

separately analyzing tip angles induced in a selected region by the first RF coil assembly and by the second RF coil assembly.

16. The method as set forth in claim 14 wherein the adjusting step includes:

adjusting at least one of a relative amplitude and a relative power of the RF electrical pulses provided to the first and second coil assemblies.

* * * * *